US010903801B2

(12) United States Patent
Yin et al.

(10) Patent No.: US 10,903,801 B2
(45) Date of Patent: Jan. 26, 2021

(54) AUDIO PROCESSING CIRCUIT AND TERMINAL DEVICE

(71) Applicant: Huawei Technologies Co., Ltd., Shenzhen (CN)

(72) Inventors: Deyang Yin, Shenzhen (CN); Jun Li, Shanghai (CN); Ding Li, Shenzhen (CN); Shuai Du, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/720,771

(22) Filed: Dec. 19, 2019

(65) Prior Publication Data

US 2020/0127613 A1 Apr. 23, 2020

Related U.S. Application Data

(63) Continuation of application No. PCT/CN2018/083521, filed on Apr. 18, 2018.

(30) Foreign Application Priority Data

Jun. 23, 2017 (CN) .......................... 2017 1 0487751

(51) Int. Cl.
*H03F 1/32* (2006.01)
*H03F 3/04* (2006.01)
(52) U.S. Cl.
CPC ............. *H03F 1/3264* (2013.01); *H03F 3/04* (2013.01); *H03F 2200/03* (2013.01)
(58) Field of Classification Search
None
See application file for complete search history.

(56) References Cited

U.S. PATENT DOCUMENTS

| 4,788,508 A | 11/1988 | Kawai |
| 9,954,494 B1* | 4/2018 | Gao .................. H03F 3/185 |
| 2006/0182265 A1 | 8/2006 | Sorace et al. |

(Continued)

FOREIGN PATENT DOCUMENTS

| CN | 102065352 A | 5/2011 |
| CN | 103716737 A | 4/2014 |

(Continued)

OTHER PUBLICATIONS

"A-weighting," From Wikipedia, Retrieved from the internet: https://en.wikipedia.org/wiki/A-weighting on Apr. 7, 2020, 7 pages.

*Primary Examiner* — Paul W Huber
(74) *Attorney, Agent, or Firm* — Conley Rose, P.C.

(57) ABSTRACT

An audio processing circuit includes a cascade operational amplifier circuit, an output node, and a pull-down circuit. The cascade operational amplifier circuit includes a first operational amplifier circuit and a second operational amplifier circuit. The first operational amplifier circuit includes a main operational amplifier and a secondary operational amplifier that are connected in parallel. The pull-down circuit is configured to pull down a voltage at the output node after the first operational amplifier circuit is turned on. The second operational amplifier circuit is configured to, after the secondary operational amplifier is turned on, control a voltage gain of the secondary operational amplifier to change gradually from low to high.

20 Claims, 9 Drawing Sheets

(56) References Cited

U.S. PATENT DOCUMENTS

| | | |
|---|---|---|
| 2006/0182266 A1 | 8/2006 | Cusinato et al. |
| 2009/0196435 A1 | 8/2009 | Miao |
| 2012/0146719 A1 | 6/2012 | Mehr et al. |
| 2014/0098974 A1* | 4/2014 | Viegas ............... H04B 15/00 381/94.5 |
| 2015/0002228 A1 | 1/2015 | Huang et al. |
| 2016/0065143 A1* | 3/2016 | Grand ................. H03F 3/185 330/252 |
| 2016/0118949 A1* | 4/2016 | Zhang ................ H03F 1/305 330/251 |
| 2017/0033744 A1 | 2/2017 | Yang et al. |
| 2017/0054416 A1 | 2/2017 | Zhu et al. |
| 2017/0063309 A1 | 3/2017 | Yadav et al. |

FOREIGN PATENT DOCUMENTS

| | | |
|---|---|---|
| CN | 104378715 A | 2/2015 |
| CN | 204697276 U | 10/2015 |
| CN | 105048980 A | 11/2015 |
| CN | 205195953 U | 4/2016 |
| EP | 2317644 A1 | 5/2011 |
| JP | 2010087811 A | 4/2010 |
| WO | 2005096529 A1 | 10/2005 |

\* cited by examiner

AUDIO PROCESSING CIRCUIT AND TERMINAL DEVICE

CROSS-REFERENCE TO RELATED APPLICATIONS

This application is a continuation application of International Patent Application No. PCT/CN2018/083521, filed on Apr. 18, 2018, which claims priority to Chinese Patent Application No. 201710487751.4, filed on Jun. 23, 2017. The disclosures of the aforementioned applications are hereby incorporated by reference in their entireties.

TECHNICAL FIELD

This application relates to the field of circuit technologies, and in particular, to an audio processing circuit and a terminal device.

BACKGROUND

After an audio circuit is powered up, an operational amplifier path establishment procedure involves establishment of an operational amplifier working point and establishment of an operational amplifier path. Because operational amplifier circuits in an audio circuit are not ideal devices, there may be an offset voltage at every stage of the operational amplifier circuits. A voltage bias generated by a front-stage operational amplifier circuit is delivered to a next-stage operational amplifier circuit, leading to a voltage difference between an output voltage in the front-stage operational amplifier circuit and an ideal voltage. As a result, an offset voltage is generated at an output node in the operational amplifier working point establishment procedure or the operational amplifier path establishment procedure. Eventually, a transient voltage at the output node has an exceptional waveform. After the exceptional voltage is transmitted from the output node to an audio load, POP noise is generated on the audio load. Because a waveform of the POP noise generated in the operational amplifier working point establishment procedure is a narrow spike in an audio range, the POP noise has a strong current impact on human ears, making the human ears uncomfortable.

SUMMARY

This application provides an audio processing circuit and a terminal device, which can resolve an issue of POP noise generated in an operational amplifier path establishment procedure in other approaches.

A first aspect of this application provides an audio processing circuit. The audio processing circuit may be implemented using hardware, or may be implemented by hardware executing corresponding software. The hardware or the software includes one or more circuits corresponding to the foregoing functions, and the circuits may be software and/or hardware. In this application, the circuit may include a cascade operational amplifier circuit, a pull-down circuit, and an output node. The output node is a node that is electrically connected to the cascade operational amplifier circuit and the audio load.

The cascade operational amplifier circuit includes a first operational amplifier circuit and a second operational amplifier circuit. The first operational amplifier circuit is a front-stage operational amplifier of the second operational amplifier circuit, and the first operational amplifier circuit includes a main operational amplifier and a secondary operational amplifier, where the main operational amplifier and the secondary operational amplifier are connected in parallel.

The cascade operational amplifier circuit is configured to amplify an input voltage, and output the amplified voltage to the output node.

The pull-down circuit is coupled to the output node, and the other end of the pull-down circuit is grounded or connected to a common mode voltage module. The pull-down circuit is configured to pull down a voltage at the output node after the first operational amplifier circuit is turned on.

The second operational amplifier circuit is configured to, after the secondary operational amplifier is turned on, control a voltage gain of the secondary operational amplifier to change gradually from low to high, to control the voltage at the output node to change gradually from low to high with gradual changing of the output resistance, and after the voltage gain of the secondary operational amplifier reaches a preset gain, turn on the main operational amplifier.

Compared with a mechanism in other approaches, in this application, the second operational amplifier circuit acting as a next-stage operational amplifier for output pulls down the voltage at the output node in the pull-down circuit. After both the first operational amplifier circuit and the second operational amplifier circuit are turned on, an output resistance of the second operational amplifier circuit is controlled to change gradually from high to low in order to control the voltage at the output node to change gradually from low to high with the gradual changing of the output resistance. In this way, in an operational amplifier path establishment procedure, the voltage at the output node can slowly increase such that generation of POP noise is reduced, and an offset voltage in the first operational amplifier circuit acting as a front-stage operational amplifier can be delivered to a load. It can be learned that, in an audio circuit structure of this application, the POP noise generated in the operational amplifier path establishment procedure can be effectively suppressed.

In some possible designs, the second operational amplifier circuit further includes a variable-resistor circuit. The main operational amplifier is connected to a first series circuit in parallel, and the first series circuit includes the secondary operational amplifier and the variable-resistor circuit that are connected in series.

The variable-resistor circuit is configured to control an output resistance of the first series circuit to change gradually from high to low in order to control the voltage gain of the secondary operational amplifier to change gradually from low to high, and to control the voltage at the output node to change gradually from low to high or from high to low. The output resistance value of the first series circuit is controlled to change gradually such that a capability of a path in which the secondary operational amplifier is located for driving the output node changes gradually and slowly, and finally increases to be enough to drive the output node, achieving an effect of slowly establishing an operational amplifier path.

In some possible designs, the variable-resistor circuit includes a ramp signal controller and a variable resistor. There may be positive/negative offset voltages in the audio circuit, both the positive/negative offset voltages generate POP noise in the operational amplifier path establishment procedure, and the generated POP noise can be reduced by the ramp signal controller. Therefore, the variable resistor may include at least one of a first ramp resistor and a second ramp resistor, which suppress the POP noise generated by the positive/negative offset voltages, respectively. An output level of the first ramp resistor is a first level, and an output level of the second ramp resistor is a second level. The ramp signal controller may control a gradually changing value of the first level or control a gradually changing value of the second level, to control a gradually changing value of the output resistance of the variable resistor. In addition, the ramp signal controller is further configured to, after both the first operational amplifier circuit and the secondary operational amplifier are turned on, control an output resistance of the variable resistor to be not lower than a first resistance value, to cut off a path between the cascade operational amplifier circuit and the output node.

Specifically, in the operational amplifier path establishment procedure, the ramp signal controller is further configured to, after both the first operational amplifier circuit and the secondary operational amplifier are turned on, control the output resistance of the variable resistor to be not lower than the first resistance value, to cut off the path between the cascade operational amplifier circuit and the output node.

Descriptions are as follows.

1. Suppression of POP Noise Generated by a Positive Offset Voltage in the Operational Amplifier Path Establishment Procedure The ramp signal controller is configured to, after both the first operational amplifier circuit and the secondary operational amplifier are turned on, control a resistance value of the variable resistor to change gradually from the first resistance value to a second resistance value, causing the voltage at the output node to increase with the gradually changing resistance value of the variable resistor, until the voltage at the output node approaches a first voltage value, where the first resistance value is greater than the second resistance value.

The first voltage value is a positive polarity voltage value, and resistance value changing of the variable resistor characterizes output resistance changing of a first series circuit.

Correspondingly, the main operational amplifier is configured to be on after the ramp signal controller controls the voltage at the output node to approach the first voltage value such that the output voltage in the cascade operational amplifier circuit drives the output node.

When the offset voltage is positive, and the variable resistor includes the first ramp resistor, the ramp signal controller is further configured to, after both the first operational amplifier circuit and the secondary operational amplifier are turned on, control a resistance value of the first ramp resistor to be not lower than the first resistance value, to cut off the path between the cascade operational amplifier circuit and the output node. For example, the resistance value of the first ramp resistor is controlled to be a high resistance, to directly disconnect the operational amplifier circuit from the output node, thereby ensuring that the voltage at the output node does not change suddenly. In this way, interference caused to human ears by the generated POP noise delivered to the audio load can be effectively avoided.

Optionally, in some possible designs, after both the first operational amplifier circuit and the second operational amplifier circuit are turned on, the ramp signal controller is configured to provide a first ramp signal.

The first ramp signal is used to control a level value of the first level to change gradually from a first level value to a second level value in order to control the resistance value of the first ramp resistor to change gradually from high to low, and control the voltage at the output node to change gradually from low to high, until the voltage at the output node approaches the first voltage value, where the first level value is greater than the second level value. The voltage at the output node may change gradually with the gradual changing of the resistance value of the first ramp resistor.

During the gradual changing of the level value of the first level, after the resistance value of the first ramp resistor is lower than a third resistance value, the output voltage in the cascade operational amplifier circuit is output to the output node, where the third resistance value is greater than or equal to the second resistance value. It can be learned that the output node slowly approaches an offset voltage through the gradual changing of the level value of the first level such that the entire operational amplifier path is slowly established, making it ready to turn on the main operational amplifier later.

It can be learned that in an initial state that the resistance value of the first ramp resistor changes gradually with change of the first ramp signal, the path between the cascade operational amplifier circuit and the output node is broken. In this way, in an initial state that the first ramp signal changes gradually, an output voltage in the operational amplifier circuit cannot be output to the output node, ensuring that the voltage at the output node does not change suddenly. Therefore, an offset voltage in the cascade operational amplifier circuit is not delivered to the output node in the operational amplifier path establishment procedure, and the output node does not deliver the offset voltage to the audio load. In this way, no POP noise is generated during the operational amplifier path establishment.

2. Suppression of POP Noise Generated by a Negative Offset Voltage in the Operational Amplifier Path Establishment Procedure The ramp signal controller is configured to, after both the first operational amplifier circuit and the secondary operational amplifier are turned on, control an output resistance of the variable resistor to change gradually from a first resistance value to a second resistance value, causing the voltage at the output node to decrease with the gradually changing resistance value of the variable resistor, until the voltage at the output node approaches a second voltage value, where the first resistance value is greater than the second resistance value, the second voltage value is a negative polarity voltage value, and resistance changing of the variable resistor characterizes output resistance changing of the first series circuit.

The main operational amplifier is configured to be on after the ramp signal controller controls the voltage at the output node to approach the second voltage value such that the output voltage in the cascade operational amplifier circuit drives the output node.

When the offset voltage is negative, and the variable resistor includes the second ramp resistor, the ramp signal controller is further configured to, after both the first operational amplifier circuit and the secondary operational amplifier are turned on, control a resistance value of the second ramp resistor to be not lower than the first resistance value, to cut off the path between the cascade operational amplifier circuit and the output node. For example, the resistance value of the second ramp resistor is controlled to be a high resistance.

In some possible designs, when both the first operational amplifier circuit and the secondary operational amplifier are turned on, the ramp signal controller is configured to provide a second ramp signal.

The second ramp signal is used to control a level value of the second level to change gradually from a third level value to a fourth level value in order to control a resistance value of the second ramp resistor to change gradually from high to low, and control the voltage at the output node to change gradually from low to high, until the voltage at the output node approaches the second voltage value, where the third level value is lower than the fourth level value. The voltage at the output node may change gradually with the gradual changing of the resistance value of the second ramp resistor.

Therefore, the gradual changing of the level value of the second level is controlled using the second ramp signal such that the second level can change gradually and slowly, instead of changing suddenly. Because the resistance value of the second ramp resistor changes gradually from high to low with the gradual changing of the second level, eventually, the voltage at the output node changes gradually from low to high with the gradual changing of the resistance value of the second ramp resistor. In this way, in the operational amplifier path establishment procedure, the voltage at the output node increases slowly, and finally approaches the second voltage value. This significantly reduces generation of POP noise compared with the mechanism in other approaches.

During the gradual changing of the level value of the second level, after the output resistance of the variable-resistor circuit is lower than a third resistance value, the path between the cascade operational amplifier circuit and the output node is made continuous, where the third resistance value is greater than or equal to the second resistance value. It can be learned that the output node can slowly approach a driving voltage through the gradual changing of the level value of the first level such that the entire operational amplifier path is slowly established, making it ready to turn on the main operational amplifier later.

In some possible designs, the ramp signal controller further includes a pulse signal generation circuit and a ramp signal control logic circuit, and the ramp signal controller further includes at least one of a first ramp current source and a second ramp current source.

The pulse signal generation circuit is connected to the ramp signal control logic circuit in series, and the first ramp current source is connected to the second ramp current source in parallel.

The pulse signal generation circuit is configured to generate a pulse signal from an input clock signal, and input the pulse signal into the ramp signal control logic circuit.

The ramp signal control logic circuit is configured to receive the pulse signal input from the pulse signal generation circuit, generate a ramp signal based on the input pulse signal, and input the generated ramp signal into a ramp current source, where the ramp signal includes the first ramp signal or the second ramp signal, and the ramp current source includes the first ramp current source or the second ramp current source.

According to a method of intermittent charging with low currents provided by the first ramp current source or the second ramp current source, a ramp signal with a moderate slope can be generated using a relatively low capacitance, thereby reducing costs without reducing integration of the entire circuit.

In some implementations, a step size and a slope of a ramp signal can be flexibly adjusted by adjusting a frequency of a clock signal, a width of a pulse signal, an output current of the ramp current source, and the capacitance value, to smooth the gradual changing of the ramp signal.

In some possible designs, when the ramp signal controller includes the first ramp current source and the second ramp current source, the ramp signal controller further includes a single-pole double-throw switch, where the single-pole double-throw switch is configured to, when the ramp signal generated by the ramp signal control logic circuit has a property that is the same as or similar to that of the first ramp signal, connect the first ramp current source, or when the ramp signal generated by the ramp signal control logic circuit has a property that is the same as or similar to that of the second ramp signal, connect the second ramp current source.

In this circuit structure, the issue of the POP noise caused by the positive/negative offset voltage in the operational amplifier in the operational amplifier path establishment procedure can be resolved using only one audio circuit, and flexible switching can be implemented.

In some possible designs, a closed-loop feedback network is formed in the operational amplifier path establishment procedure, there may be an oscillation in the feedback network, and the oscillation leads to sudden and sharp POP noise. Therefore, to further eliminate the POP noise generated due to the oscillation in the operational amplifier path establishment procedure, a compensation circuit may be further added in this application to avoid the POP noise caused by an oscillation signal in the feedback network. Specifically, a loop compensation circuit may be provided in the audio processing circuit, where the loop compensation circuit is configured to suppress an oscillation signal in a closed loop through a sink current circulation. This not only suppresses the POP noise generated by the oscillation signal, but also maintains a gain stability of the closed-loop system.

In some possible designs, the cascade operational amplifier circuit is a cascade operational amplifier, and the cascade operational amplifier circuit includes at least one second operational amplifier circuit, where the at least one second operational amplifier circuit includes the secondary operational amplifier and the ramp signal controller. Whether each operational amplifier circuit is provided with a secondary operational amplifier and a variable-resistor circuit is not limited in this application. Any operational amplifier circuit may be provided with a secondary operational amplifier and a variable-resistor circuit, and this can block the offset voltage from being delivered to the output node. At which stage or stages the operational amplifier circuit is provided with a secondary operational amplifier and a variable-resistor circuit is not limited in this application either.

Further, a secondary operational amplifier and a variable-resistor circuit may be limited to be configured only at a non-ideal device that makes great POP noise impact. If an offset voltage of a main operational amplifier in the second operational amplifier circuit is higher than a preset threshold, the main operational amplifier whose offset voltage is higher than the preset threshold may be provided with a secondary operational amplifier and a variable-resistor circuit. In design of a POP noise suppression circuit, all or some of these non-ideal devices may be provided with a secondary operational amplifier and a variable-resistor circuit. This is not limited in this application.

A second aspect of this application provides a terminal device, including an audio load and the audio processing circuit described in the first aspect.

Still another aspect of this application provides a computer readable storage medium, where an instruction is stored in the computer readable storage medium, and when the instruction is run on a computer, the computer is enabled to perform operations performed by the audio processing circuit according to any one of the foregoing aspects.

Yet another aspect of this application provides a computer program product, where the computer program product includes a computer software instruction, and the computer software instruction may be loaded using a processing circuit, to implement operations performed by the audio processing circuit according to any one of the foregoing aspects.

Compared with other approaches, in the solutions of the present disclosure, the operational amplifier circuit in the audio circuit includes the first operational amplifier circuit and the second operational amplifier circuit. The first operational amplifier circuit is a front-stage operational amplifier for output to the second operational amplifier circuit. The second operational amplifier circuit acting as a next-stage operational amplifier for output pulls down the voltage at the output node in the pull-down circuit. After both the first operational amplifier circuit and the second operational amplifier circuit are turned on, the output resistance of the second operational amplifier circuit is controlled to change gradually from high to low in order to control the voltage at the output node to change gradually from low to high with the gradual changing of the output resistance. In this way, in the operational amplifier path establishment procedure, the voltage at the output node can slowly increase such that generation of the POP noise is reduced, and the offset voltage in the first operational amplifier circuit acting as a front-stage operational amplifier can be delivered to a load. It can be learned that, in an audio circuit structure of this application, the POP noise generated in the operational amplifier path establishment procedure can be effectively suppressed.

DESCRIPTION OF EMBODIMENTS

In the specification, claims, and accompanying drawings of this application, the terms "first", "second", and so on are intended to distinguish between similar objects but do not necessarily indicate a specific order or sequence. It should be understood that the data termed in such a way are interchangeable in proper circumstances so that the embodiments of the present disclosure described herein can be implemented in other orders than the order illustrated or described herein. In addition, the terms "include", "have", or any other variant thereof are intended to cover a non-exclusive inclusion. For example, a process, a method, a system, a product, or a device that includes a series of steps or circuits is not necessarily limited to the steps or circuits that are expressly listed, but may include another step or circuit not expressly listed or inherent to the process, the method, the product, or the device. The circuit division in this application is merely logical division, and there may be another division during implementation in an embodiment. For example, a plurality of circuits may be combined or integrated into another system, or some features may be ignored or not performed. In addition, the displayed or discussed mutual couplings or direct couplings or communication connections may be implemented through some interfaces. The indirect couplings or communication connections between the circuits may be implemented in electronic or another form, and this is not limited in this application. In addition, circuits or sub-circuits described as separate parts may be or may not be physically separated, may be or may not be physical circuits, or may be distributed in a plurality of circuits. Some or all of the circuits may be selected based on actual requirements to achieve objectives of the solutions of this application.

Figure 1:
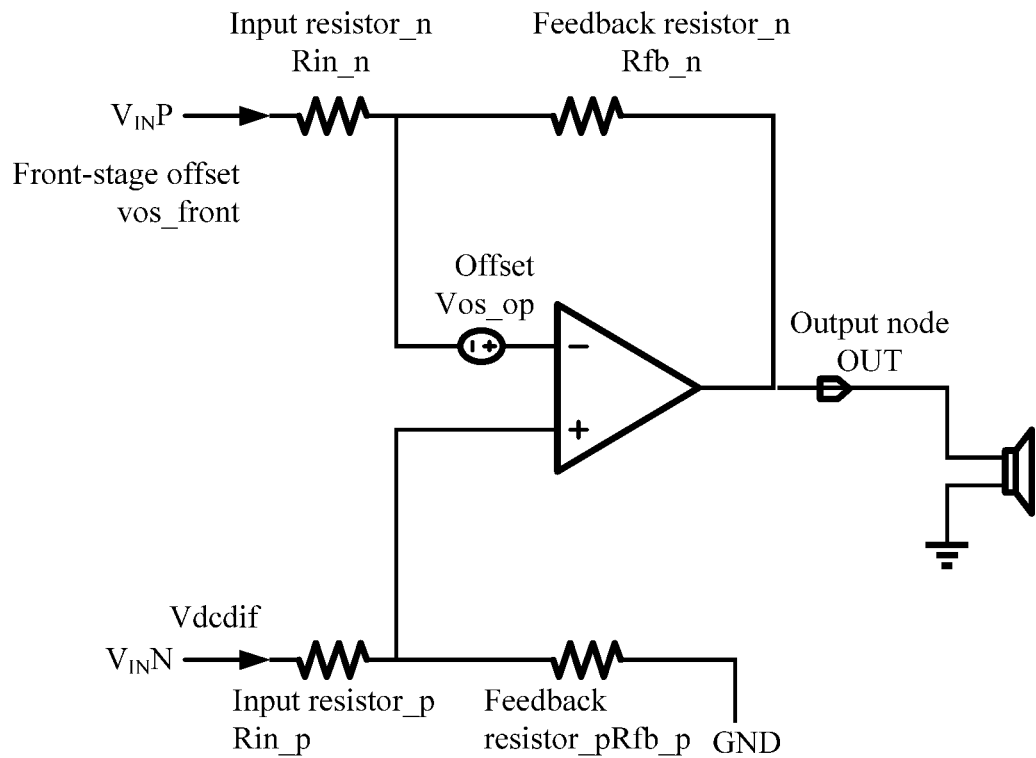
FIG. 1 is a schematic structural diagram of an audio circuit in a mechanism in other approaches.

This application provides an audio processing circuit and a terminal device that can be used in an audio circuit, for example, an audio accessory such as an earphone or a mobile phone, or a terminal device with an audio play function. In a mechanism in other approaches, as shown in FIG. 1, before an operational amplifier is turned on, there is a high resistance. Because of a common mode voltage (VCM) switch and a load, an output (OUT) node is driven to VCM (in a case of AC coupling) or ground ((GND) in a case of DC output). After the operational amplifier is turned on, because the operational amplifier is non-ideal, the operational amplifier drives the OUT node to VCM+Vos (Vos is a full path offset voltage, and may also be referred to as an offset) in the case of AC coupling, or the operational amplifier drives the OUT node to GND+Vos in the case of DC output.

The operational amplifier has an offset Vos_op, and a front-stage operational amplifier of the operational amplifier also delivers a front-stage offset Vos_front to the operational amplifier. In an operational amplifier path establishment procedure, there is a level difference (which is VACdif in the case of AC coupling or VDCdif in the case of DC output) between the front-stage operational amplifier of the operational amplifier and the OUT node, and there is also a difference Δ between a feedback coefficient (Rfb_p/Rin_p)

and a feedback coefficient (Rfb_n/Rin_n). Therefore, a final output voltage offset of the OUT node is about VACdif×Δ or VDCdif×Δ.

It can be learned that, in a process of the voltage at the OUT node changing from VCM to VCM+Vos, or changing from GND to GND+Vos, the generated offset is delivered to an audio load, leading to generation of POP noise.

To resolve the foregoing technical problems, this application mainly provides one of the following circuits.

1. One secondary operational amplifier circuit is connected in parallel only between two ends of a last-stage operational amplifier circuit (that is, an operational amplifier circuit electrically connected to the OUT node) of a cascade operational amplifier.

2. One secondary operational amplifier circuit is connected in parallel between two ends of an operational amplifier circuit at each stage of the cascade operational amplifier.

3. One secondary operational amplifier circuit is connected in parallel only between two ends of an operational amplifier circuit in which an operational amplifier offset voltage exceeds a preset threshold.

4. One secondary operational amplifier circuit is connected in parallel only between two ends of an operational amplifier circuit at several front stages of the cascade operational amplifier.

Each of the foregoing four secondary operational amplifier circuits includes a variable-resistor circuit. After any one of the foregoing four circuits is used, at the beginning of the operational amplifier path establishment, only a front-stage operational amplifier circuit of an operational amplifier circuit connected to a secondary operational amplifier circuit in parallel is turned on, and the secondary operational amplifier circuit is turned on. In an initial state of the operational amplifier path establishment, a resistance value of a variable resistor in the secondary operational amplifier circuit is presented as a high resistance externally such that an offset voltage in the operational amplifier circuit in which the variable resistor is located is not delivered to the OUT node, and does not drive the OUT node to provide a voltage to the audio load. In this way, a path between the entire cascade operational amplifier and the OUT node is cut off at the beginning of the operational amplifier path establishment.

In the operational amplifier path establishment procedure, a variable-resistor circuit in each secondary operational amplifier circuit externally presents a ramp (uphill or downhill) change, with a resistance slowly increasing or decreasing such that an output voltage in the entire secondary operational amplifier circuit also increases slowly, and gradually reaches an offset voltage, to drive the OUT node. After the output voltage in the secondary operational amplifier circuit reaches the offset voltage, an operational amplifier circuit connected to the secondary operational amplifier circuit in parallel can be turned on. In this way, the entire operational amplifier path is finally established.

Figure 2:
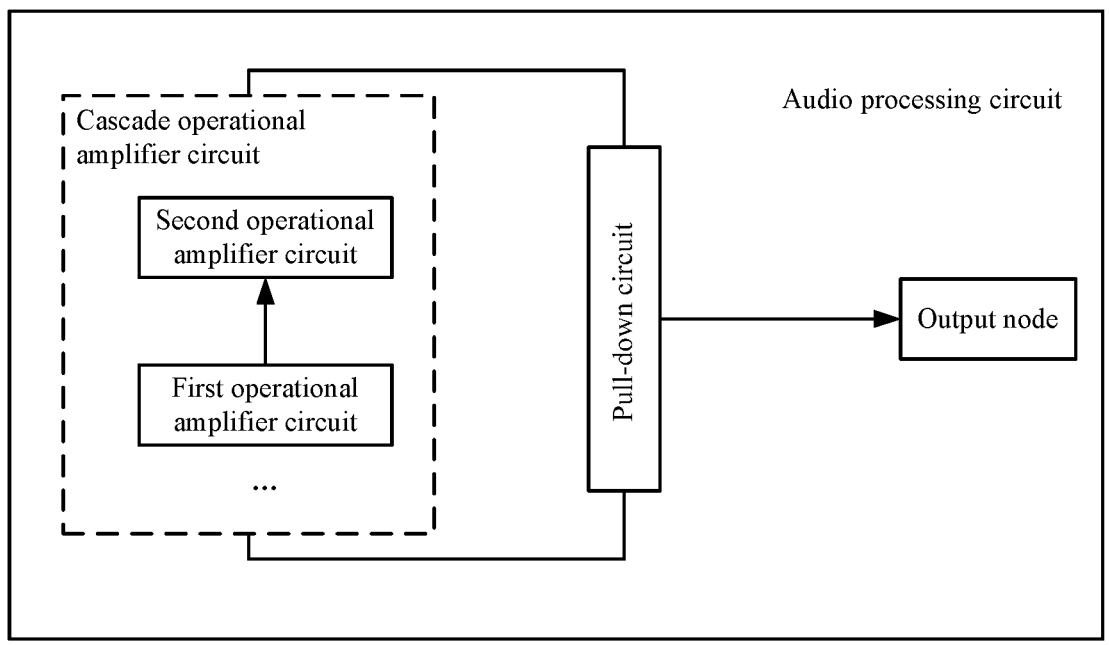
FIG. 2 is a schematic structural diagram of an audio processing circuit according to an embodiment of the present disclosure.

Refer to FIG. 2. The following describes an audio processing circuit according to this application for example. The circuit may be used in an AC coupling scenario and a DC output scenario. The circuit may include a cascade operational amplifier circuit, an output node, and a pull-down circuit.

The cascade operational amplifier circuit includes a first operational amplifier circuit and a second operational amplifier circuit. The first operational amplifier circuit is a front-stage operational amplifier of the second operational amplifier circuit, and the first operational amplifier circuit includes a main operational amplifier and a secondary operational amplifier, where the main operational amplifier and the secondary operational amplifier are connected in parallel. The cascade operational amplifier circuit is configured to amplify an input voltage, and output the amplified voltage to the output node. After the first operational amplifier circuit amplifies the voltage input to the circuit, the amplified voltage is input to the second operational amplifier circuit, causing the second operational amplifier circuit to process the input voltage and then output the processed voltage to the output node.

An end of the pull-down circuit is coupled to the output node, and the other end of the pull-down circuit may be grounded (in a case of DC output) or connected to a common mode voltage module (in a case of AC coupling). The pull-down circuit is configured to pull down a voltage at the output node after the first operational amplifier circuit is turned on. Pull-down means pulling down the voltage at the output node from high (H) to low (L).

The second operational amplifier circuit is configured to, after the secondary operational amplifier is turned on, control a voltage gain of the secondary operational amplifier to change gradually from low to high in order to control the voltage at the output node to change gradually from low to high with gradual changing of the output resistance, and after the voltage gain of the secondary operational amplifier reaches a preset gain, turn on the main operational amplifier. It should be noted that the voltage at the output node that gradually changes from low to high is an absolute value of the voltage at the output node, and is not limited to be positive or negative.

In this embodiment of the present disclosure, the second operational amplifier circuit acting as a next-stage operational amplifier for output pulls down the voltage at the output node in the pull-down circuit. After both the first operational amplifier circuit and the second operational amplifier circuit are turned on, an output resistance of the second operational amplifier circuit is controlled to change gradually from high to low in order to control the voltage at the output node to change gradually from low to high with the gradual changing of the output resistance. In this way, in an operational amplifier path establishment procedure, the voltage at the output node can slowly increase such that generation of POP noise is reduced, and an offset voltage in the first operational amplifier circuit acting as a front-stage operational amplifier can be delivered to a load. It can be learned that, in an audio circuit structure of this application, the POP noise generated in the operational amplifier path establishment procedure can be effectively suppressed.

Optionally, in some embodiments of the present disclosure, the cascade operational amplifier circuit may include at least one second operational amplifier circuit. In the foregoing embodiment, when the voltage at the output node is controlled to change gradually from low to high by controlling a voltage gain of the secondary operational amplifier to change gradually from low to high, the gradual changing of the voltage at the output node may be controlled by controlling an output resistance of the first operational amplifier circuit to change gradually from high to low. Specifically, the at least one second operational amplifier circuit may further include a variable-resistor circuit, the main operational amplifier is connected to a first series circuit in parallel, and the first series circuit includes the secondary operational amplifier and the variable-resistor circuit that are connected in series.

The variable-resistor circuit may be configured to control an output resistance of the variable resistor to change gradually from high to low in order to control the voltage gain of the secondary operational amplifier to change gradually from low to high, and to control the voltage at the output node to change gradually from low to high, in other words, to make a gain of the cascade operational amplifier circuit change gradually from low to high. The voltage at the output node may change gradually with the gradual changing of the output resistance of the variable resistor.

Correspondingly, after the gradual changing of the output resistance of the variable resistor controlled by the variable-resistor circuit ends, the main operational amplifier is turned on such that an operational amplifier path from the first operational amplifier circuit to the main operational amplifier and then to the output node is established.

It can be learned that the main operational amplifier and the secondary operational amplifier share a same front-stage operational amplifier (that is, the first operational amplifier circuit), and share a same external feedback network. This ensures that offset values of offset voltages in paths in which the main operational amplifier and the secondary operational amplifier are located are the same, and also ensures that feedback coefficients of the main operational amplifier and the secondary operational amplifier are the same. After the circuit structure is used, first, the path in which the secondary operational amplifier is located is made continuous, to make an equivalent of a driving capability of the main operational amplifier for driving the output node. In addition, a capability of the path in which the secondary operational amplifier is located for driving the output node changes gradually and slowly, and finally increases to be enough to drive the output node to deliver an output to an audio load. Then, the main operational amplifier is turned on to switch the operational amplifier path back to the path in which the main operational amplifier is located. Finally, the POP noise generated in the operational amplifier path establishment procedure can be greatly reduced, to reduce the discomfort that the POP noise brings to human ears.

Figure 3:
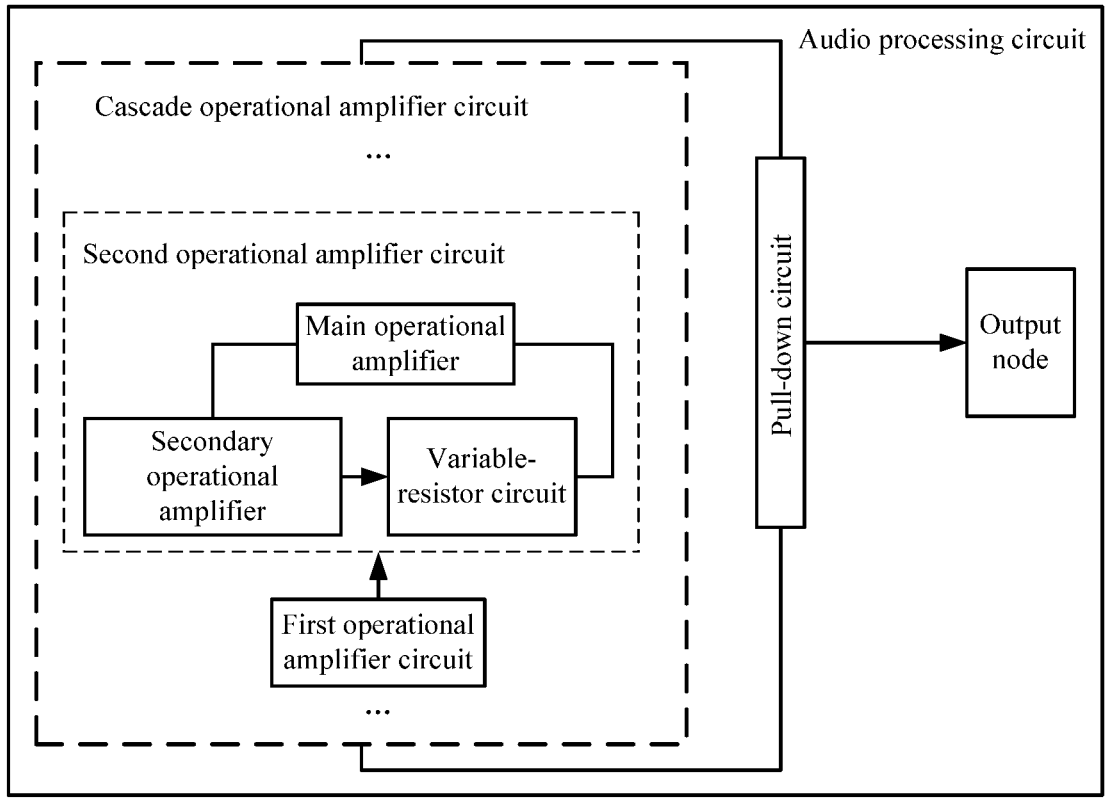
FIG. 3 is another schematic structural diagram of an audio processing circuit according to an embodiment of the present disclosure.

When the cascade operational amplifier circuit is a cascade operational amplifier, whether each operational amplifier circuit is provided with a secondary operational amplifier and a variable-resistor circuit is not limited in this application. Any operational amplifier circuit may be provided with a secondary operational amplifier and a variable-resistor circuit, and this can block an offset voltage in the operational amplifier circuit from being delivered to the output node. At which stage or stages the operational amplifier circuit is provided with a secondary operational amplifier and a variable-resistor circuit is not limited in this application either. For a specific circuit diagram, refer to a structure shown in FIG. 3. Variations to the circuit such as addition and modification may be made based on FIG. 3. This is not specifically limited in this application.

Figure 4A:
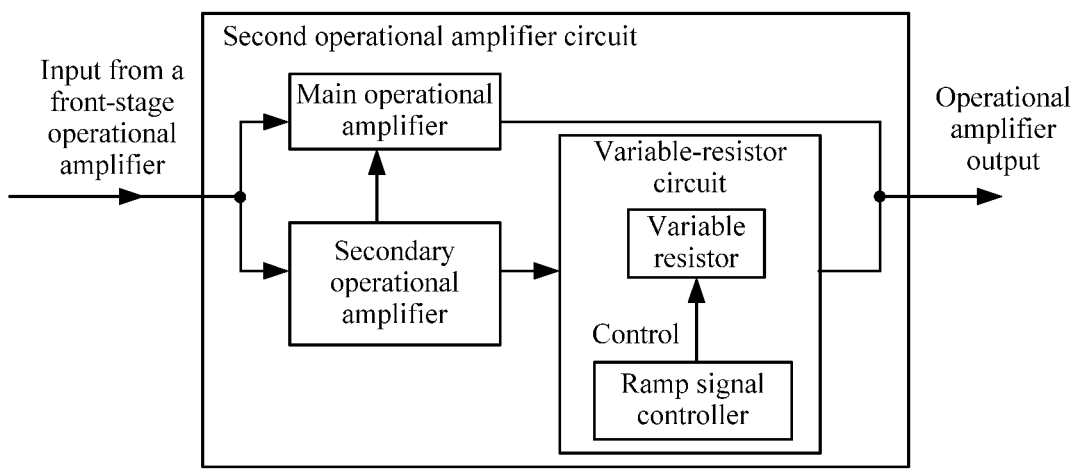
FIG. 4A is a schematic structural diagram of a second operational amplifier circuit according to an embodiment of the present disclosure.

Optionally, in some implementations, the gradual changing of the output resistance of the variable resistor may be controlled by inputting a signal. The variable-resistor circuit may include a variable resistor and a ramp signal controller (as shown in the circuit structure diagram in FIG. 4A). The ramp signal controller may control an output resistance of the variable resistor, and the ramp signal controller may also be considered as controlling a resistance value changing of the variable resistor. Optionally, the ramp signal controller in this application may directly generate a ramp signal to control the resistance value changing of the variable resistor, or may control the resistance value changing of the variable resistor based on a control signal delivered from another circuit. A specific structure is not limited in this application.

In an embodiment, after the audio processing circuit is powered up, there may be two cases in the operational amplifier path establishment procedure the offset voltage in the operational amplifier circuit is positive/negative. Therefore, after both the first operational amplifier circuit and the secondary operational amplifier are turned on, the ramp signal controller needs to control the gradual changing of the output resistance of the variable resistor based on the positive/negative property of the offset voltage. The following describes a POP suppression process in the operational amplifier path establishment procedure after the power-up.

1. When the Offset Voltage is Positive

The ramp signal controller is configured to, after both the first operational amplifier circuit and the secondary operational amplifier are turned on, control a resistance value of the variable resistor to change gradually from a first resistance value to a second resistance value, causing the voltage at the output node to increase with the gradually changing resistance value of the variable resistor, until the voltage at the output node approaches a first voltage value.

The first resistance value may be set to be greater than the second resistance value, and the first resistance value may be set to a high resistance, to directly cut off a path between the operational amplifier circuit and the output node at the beginning of the operational amplifier path establishment. Alternatively, the first resistance value may be set to make an output voltage in the operational amplifier circuit unable to drive the output node in the operational amplifier path establishment procedure.

The first voltage value is a positive polarity voltage value, and resistance value changing of the variable resistor characterizes output resistance changing of a first series circuit.

It can be understood that, when the voltage at the output node reaches the first voltage value, it indicates that the voltage at the output node reaches an offset voltage in the cascade operational amplifier circuit, where the offset voltage in the cascade operational amplifier circuit is an output voltage offset of the cascade operational amplifier circuit.

The first voltage value may be determined by an offset voltage in an operational amplifier circuit before the second operational amplifier circuit. The offset voltage in the operational amplifier circuit before the second operational amplifier circuit may include an offset voltage in the first operational amplifier circuit, or may further include an offset voltage in an operational amplifier circuit before the first operational amplifier circuit. This is not specifically limited in this application. Optionally, the first voltage value may be calculated based on a parameter such as a feedback coefficient.

Correspondingly, the main operational amplifier is configured to be on after the ramp signal controller controls the voltage at the output node to approach the first voltage value such that the output voltage in the cascade operational amplifier circuit drives the output node. Because the output node has reached a final offset voltage (offset) before the main operational amplifier is turned on, a voltage status of the output node does not change suddenly after the main operational amplifier is turned on. Therefore, turning on the main operational amplifier after the voltage at the output node gradually climbs to a preset offset can effectively reduce POP noise caused by a sudden change of the voltage at the output node.

2. When the Offset Voltage is Negative

The variable-resistor circuit includes a ramp signal controller. The ramp signal controller is configured to, after both the first operational amplifier circuit and the secondary operational amplifier are turned on, control an output resistance of the variable resistor to change gradually from a first resistance value to a second resistance value, causing the voltage at the output node to decrease with the gradually changing value of the output resistance of the variable resistor, until the voltage at the output node approaches a second voltage value. It can be understood that, when the voltage at the output node reaches the second voltage value, it indicates that the voltage at the output node reaches the offset voltage in the cascade operational amplifier circuit.

The second voltage value may be determined by an offset voltage in an operational amplifier circuit before the second operational amplifier circuit. The offset voltage in the operational amplifier circuit before the second operational amplifier circuit may include an offset voltage in the first operational amplifier circuit, or may further include an offset voltage in an operational amplifier circuit before the first operational amplifier circuit. This is not specifically limited in this application. The second voltage value may also be calculated based on a parameter such as a feedback coefficient.

Correspondingly, the main operational amplifier is configured to be on after the ramp signal controller controls the voltage at the output node to approach the second voltage value such that the output voltage in the cascade operational amplifier circuit drives the output node.

It should be noted that, in this application, when the offset voltage in the operational amplifier circuit is positive, the gradually changing value of the node voltage at the output node negatively increases, and when the offset voltage in the operational amplifier circuit is negative, the gradually changing value of the voltage at the output node positively increases. In addition, the ramp signal controller in this application may be an external circuit that is separately disposed, or may be integrated into the variable-resistor circuit. A ramp signal that drives a resistance value of the variable resistor to change gradually may be provided by the ramp signal controller, or may be provided by a circuit other than the variable-resistor circuit. This is not specifically limited in this application.

It can be learned that offset voltages in all paths in an operational amplifier feedback network can be slowly formed using the secondary operational amplifier and the variable-resistor circuit, to slowly establish an operational amplifier path, until the operational amplifier path is completely established. In this way, restriction on an offset voltage in another circuit in the path can be lifted.

Optionally, in some embodiments of the present disclosure, the variable resistor may include at least one of a first ramp resistor and a second ramp resistor, and the first ramp resistor or the second ramp resistor is controlled by the ramp signal controller. For the first ramp resistor, a resistance value of the ramp resistor decreases with a decrease of voltages at two ends of the ramp resistor, and increases with an increase of the voltages at the two ends of the ramp resistor. For the second ramp resistor, a resistance value of the ramp resistor decreases with an increase of voltages at two ends of the ramp resistor, and increases with a decrease of the voltages at the two ends of the ramp resistor.

When both a first ramp resistor and a second ramp resistor are disposed in a circuit, the ramp signal controller may switch between the first ramp resistor and the second ramp resistor, or may control resistance value changing of both the first ramp resistor and the second ramp resistor, and provide a corresponding ramp signal to control a gradually changing value of the variable resistor, to adapt to diverse changes of the circuit. For ease of description, it may be specified that an output level of the first ramp resistor is a first level, and an output level of the second ramp resistor is a second level. In an audio processing circuit, a variable-resistor circuit may be configured only for a negative offset voltage, or may be configured only for a positive offset voltage, or may be configured for both a negative offset voltage and a positive offset voltage.

The first ramp resistor and/or the second ramp resistor are configured in the circuit, to suppress POP noise generated by negative/positive offset voltages, respectively.

When the variable-resistor circuit is configured for a negative offset voltage, a first ramp resistor with a gradually positively changing resistance value may be configured as a variable resistor in the variable-resistor circuit, and the ramp signal controller may control gradual changing of the resistance value of the first ramp resistor. Specifically, the ramp signal controller is further configured to, after both the first operational amplifier circuit and the secondary operational amplifier are turned on, control the resistance value of the second ramp resistor to be not lower than the first resistance value, to cut off the path between the cascade operational amplifier circuit and the output node. For example, the resistance value of the second ramp resistor is controlled to be a high resistance.

When the variable-resistor circuit is configured for a positive offset voltage, a second ramp resistor with a gradually negatively changing resistance value may be configured as a variable resistor in the variable-resistor circuit, and the ramp signal controller may control gradual changing of the resistance value of the second ramp resistor. Specifically, the ramp signal controller is further configured to, after both the first operational amplifier circuit and the secondary operational amplifier are turned on, control the resistance value of the first ramp resistor to be not lower than the first resistance value, to cut off the path between the cascade operational amplifier circuit and the output node. For example, the resistance value of the first ramp resistor is controlled to be a high resistance, to directly disconnect the operational amplifier circuit from the output node. This ensures that the voltage at the output node does not change suddenly, thereby effectively avoiding interference caused to human ears by the generated POP noise delivered to an audio load.

Certainly, a negative offset voltage or a positive offset voltage may be periodically generated in the circuit. To well resolve the issue of positive/negative offset voltages, this application may further provide variable resistors for the negative offset voltage and the positive offset voltage. To be specific, the variable-resistor circuit is configured as a first ramp resistor with a gradually positively changing resistance value, and the variable resistor is configured as a second ramp resistor with a gradually negatively changing resistance value. Then, one of the ramp resistors is turned on (the first ramp resistor or the second ramp resistor is turned on) in the operational amplifier path establishment procedure, and the ramp signal controller controls gradual changing of a resistance value of the first ramp resistor/the second ramp resistor. Alternatively, both the first ramp resistor and the second ramp resistor are turned on, and the ramp signal controller controls gradual changing of resistance values of the first ramp resistor/the second ramp resistor. This can deal with POP noise scenarios caused by diverse voltage offsets.

The ramp signal controller is further configured to control a gradually changing value of the first level or control a gradually changing value of the second level in order to control the gradually changing value of the output resistance of the variable resistor.

The following describes manners of controlling resistance values of the first ramp resistor and the second ramp resistor to control the voltage at the output node.

1. When the ramp signal controller includes the first ramp resistor, an issue of POP noise generated when the offset voltage is positive in the operational amplifier path establishment procedure can be resolved.

The ramp signal controller may be configured to, after both the first operational amplifier circuit and the secondary operational amplifier are turned on, control the resistance value of the first ramp resistor to be not lower than the first resistance value, to make the output voltage in the cascade operational amplifier circuit unable to drive the output node, and even cut off the path between the cascade operational amplifier circuit and the output node.

In the operational amplifier path establishment procedure, after both the first operational amplifier circuit and the second operational amplifier circuit are turned on, the ramp signal controller may provide a first ramp signal to the variable-resistor circuit. The first ramp signal is used to control a level value of the first level to change gradually from a first level value to a second level value in order to control a resistance value of the first ramp resistor to change gradually from high to low. The voltage at the output node changes gradually from low to high with the gradual changing of the resistance value of the first ramp resistor, until the voltage at the output node approaches the first voltage value. The first voltage value is a positive polarity voltage value, and resistance value changing of the variable resistor characterizes output resistance changing of a first series circuit. The first level value is greater than the second level value. It means that the first ramp signal may control the level value of the first level to decrease slowly in order to control the resistance value of the first ramp resistor to decrease slowly. In an initial state that the resistance value of the first ramp resistor changes gradually with change of the first ramp signal, the path between the cascade operational amplifier circuit and the output node is broken. In this way, POP noise generated due to a sudden change of a voltage at the beginning of the operational amplifier path establishment is not delivered to the output node, and certainly not delivered to an audio load through the output node.

Therefore, the gradual changing of the level value of the first level is controlled using the first ramp signal such that the first level can change gradually and slowly, instead of changing suddenly. Because the resistance value of the first ramp resistor changes gradually from high to low with the gradual changing of the first level, eventually, the voltage at the output node changes gradually from low to high with the gradual changing of the resistance value of the first ramp resistor. In this way, in the operational amplifier path establishment procedure, the voltage at the output node increases slowly, and finally approaches a preset offset (for example, the first voltage value or the second voltage value). This significantly reduces generation of POP noise compared with the mechanism in other approaches.

In the process in which the voltage at the output node changes gradually from low to high with the gradual changing of the resistance value of the first ramp resistor, after the resistance value of the first ramp resistor is lower than a third resistance value, the output voltage of the cascade operational amplifier circuit may drive the output node, where the third resistance value is greater than or equal to the second resistance value. It can be learned that the gradual changing of the level value of the first level may enable the output node to slowly approach the output voltage such that the entire operational amplifier path is slowly established, making it ready to turn on the main operational amplifier later. In this way, the voltage at the output node increases gradually with an increase of the output voltage in the cascade operational amplifier circuit. After the output node is driven, the output node may deliver an output of the cascade operational amplifier circuit to an audio load that is electrically connected to the output node, and an operational amplifier feedback loop is made continuous, to drive the audio load to operate. Then, the resistance value of the first ramp resistor continues to change gradually from the third resistance value to the second resistance value.

In some implementations, at the beginning of the operational amplifier path establishment, if the output voltage in the operational amplifier circuit is quite low, and if the output voltage is lower than a lowest high level of the output node, the output voltage in the cascade operational amplifier circuit cannot drive the output node to operate. In this way, at the beginning of the operational amplifier path establishment, an offset voltage in an operational amplifier circuit at each stage is not instantaneously delivered to the audio load behind the output node, but is blocked or decreases abruptly at the output node.

If the cascade operational amplifier circuit is in a high resistance state at the beginning of the operational amplifier path establishment, that is, in an initial state that the output resistance of the variable resistor changes gradually with changing of the first ramp signal, the path between the cascade operational amplifier circuit and the output node is broken, and an offset voltage in the cascade operational amplifier circuit is not delivered to the output node, and certainly not delivered to the audio load connected to the output node. In this way, generation of POP noise in an operational amplifier path establishment device can be effectively avoided.

2. When the ramp signal controller includes a second ramp resistor, an issue of POP noise generated when the offset voltage is negative in the operational amplifier path establishment procedure can be resolved.

The ramp signal controller may be configured to, after both the first operational amplifier circuit and the secondary operational amplifier are turned on, control the resistance value of the second ramp resistor to be not lower than the first resistance value, to make the output voltage in the cascade operational amplifier circuit unable to drive the output node, and even cut off the path between the cascade operational amplifier circuit and the output node.

In the operational amplifier path establishment procedure, when both the first operational amplifier circuit and the secondary operational amplifier are turned on, the ramp signal controller may provide a second ramp signal to the second ramp resistor.

The second ramp signal is used to control a level value of the second level to change gradually from a third level value to a fourth level value in order to control the resistance value of the second ramp resistor to change gradually from high to low. The voltage at the output node changes gradually from low to high with the gradual changing of the resistance value of the second ramp resistor, until the voltage at the output node approaches the second voltage value.

The third level value is less than the fourth level value. It means that the second ramp signal may control the level value of the second level to increase slowly in order to control the resistance value of the second ramp resistor to decrease slowly. The first resistance value is greater than the second resistance value. The second voltage value is a negative polarity voltage value, and resistance value changing of the variable resistor characterizes output resistance changing of a first series circuit.

Optionally, if the resistance value of the second ramp resistor is controlled to be presented as a high resistance in an initial state that the level value of the second level changes gradually, then in an initial state that the resistance value of the second ramp resistor changes gradually with changing of the second ramp signal, the path between the cascade operational amplifier circuit and the output node is broken, which can directly disconnect the operational amplifier circuit from the output node, and can completely prevent the offset voltage in the operational amplifier circuit from being delivered to the output node.

Therefore, the gradual changing of the level value of the second level is controlled using the second ramp signal such that the second level can change gradually and slowly, instead of changing suddenly. Because the resistance value of the second ramp resistor changes gradually from high to low with the gradual changing of the second level, eventually, the voltage at the output node changes gradually from low to high with the gradual changing of the resistance value of the second ramp resistor. In this way, in the operational amplifier path establishment procedure, the voltage at the output node increases slowly, and finally approaches the second voltage value. This significantly reduces generation of POP noise compared with the mechanism in other approaches.

In a process of controlling the second ramp signal, after the resistance value of the second ramp resistor is lower than a third resistance value, the output node is driven, and the path between the cascade operational amplifier circuit and the output node is made continuous, where the third resistance value is greater than or equal to the second resistance value. Then, the resistance value of the second ramp resistor continues to change gradually from the third resistance value to the second resistance value.

Optionally, in some embodiments of the present disclosure, the ramp signal controller further includes a pulse signal generation circuit and a ramp signal control logic circuit, and the ramp signal controller further includes at least one of a first ramp current source and a second ramp current source.

The pulse signal generation circuit is connected to the ramp signal control logic circuit in series.

The pulse signal generation circuit is configured to generate a pulse signal from an input clock signal, and input the pulse signal into the ramp signal control logic circuit.

The ramp signal control logic circuit is configured to receive the pulse signal input from the pulse signal generation circuit, generate a ramp signal based on the input pulse signal, and input the generated ramp signal into a ramp current source, where the ramp signal includes the first ramp signal or the second ramp signal, and the ramp current source includes the first ramp current source or the second ramp current source.

If the ramp signal controller includes both the first ramp current source and the second ramp current source, the first ramp current source may be connected to the second ramp current source in parallel. When the offset voltage is positive, the first ramp signal is generated to provide a current for the first ramp current source, and when the offset voltage is negative, the first ramp signal is generated to provide a current for the second ramp current source. Specifically, switching may be performed between the first current source and the second current source by controlling turn-on using a single-pole double-throw switch, a two-way controllable switch, or an enable signal. A specific switching manner is not limited in this application.

Figure 5:
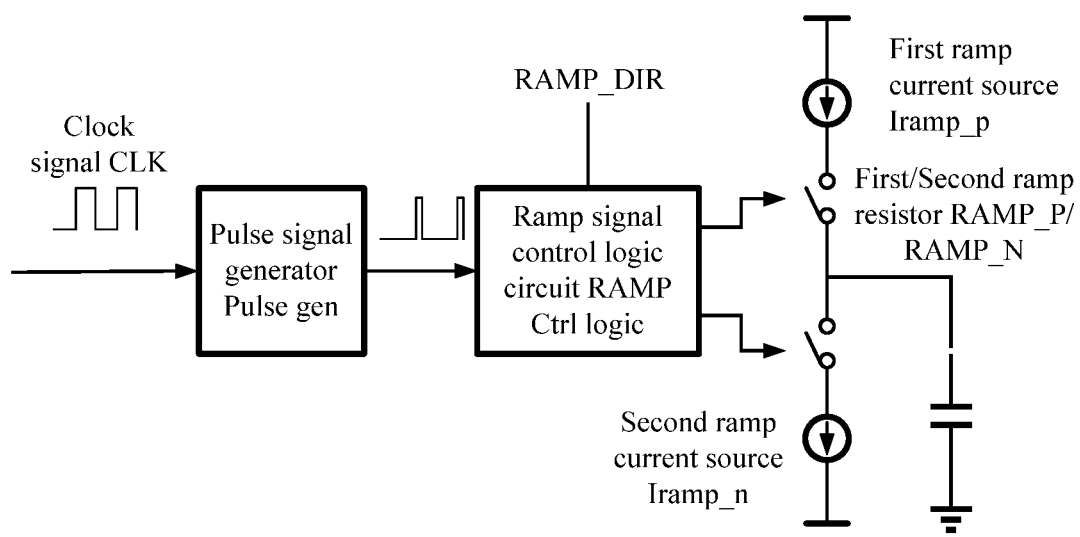
FIG. 5 is a schematic structural diagram of a ramp signal controller according to an embodiment of the present disclosure.

Optionally, in some implementations, FIG. 5 is another schematic circuit structure diagram of a variable-resistor circuit. When the ramp signal controller includes the first ramp current source and the second ramp current source, the ramp signal controller may include a single-pole double-throw switch, where the single-pole double-throw switch is configured to, when the ramp signal generated by the ramp signal control logic circuit has a property that is the same as or similar to that of the first ramp signal, connect the first ramp current source, or when the ramp signal generated by the ramp signal control logic circuit has a property that is the same as or similar to that of the second ramp signal, connect the second ramp current source.

It can be learned that, with this circuit structure, an issue of POP noise caused by a positive/negative offset voltage in the operational amplifier in the operational amplifier path establishment procedure can be resolved using only one audio circuit, and flexible switching can be implemented.

In FIG. 5, a method of intermittent charging with low currents is used such that a ramp signal with a moderate slope can be generated using a relatively low capacitance, thereby reducing costs without reducing integration of the entire circuit.

In some implementations, a step size and a slope of a ramp signal (RAMP) can be flexibly adjusted by adjusting a frequency of a clock signal (CLK for short), a width of a pulse signal, an output current Tramp of the ramp current source, and a capacitance, to smooth the gradual changing of the ramp signal.

In addition, in different phases, sensitivity to impact of gradual changing of a RAMP_P or a RAMP_N on change of an offset voltage (Vos) finally output from the cascade operational amplifier circuit varies, and therefore a power-on time can be optimized using a method of phase-based ramp signal slope adjustment. Specifically, in a Vos impact-insensitive phase, a ramp signal speed can be increased, and in a Vos impact-sensitive phase, the ramp signal speed can be decreased.

Figure 4B:
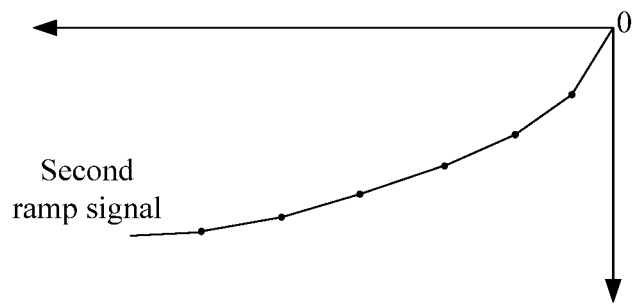
FIG. 4B is a schematic diagram of a second ramp signal curve according to an embodiment of the present disclosure.

In this embodiment of this application, the first ramp signal or the second ramp signal may include a plurality of segment functions. Slopes in functions are almost the same from a micro perspective, and therefore changes are relatively smooth. A slope may be controlled using a switching time length. For example, a ramp signal is 1 pmA at this time, and a relatively short time may be set, and the ramp is set to 1 umA at a next step, and a relatively long time may be set. In this way, a sudden change of a ramp signal can be smoothed, to reduce POP noise caused by a sudden change of a voltage. For example, the second ramp signal may be represented by the curve shown in FIG. 4B.

Because the ramp signal needs to be slow enough and a relatively large capacitance cannot be applied, a capacitor in the variable-resistor circuit is charged using a clock to generate a narrow pulse period signal in order to generate a slow enough ramp signal (that is, a RAMP_P/RAMP_N). In addition, the RAMP-N and the RAMP-P each are connected to one ramp signal. When POP noise suppression is enabled, an electrical connection needs to be established to only one of the RAMP-N and the RAMP-P.

Optionally, in some embodiments of the present disclosure, a closed-loop feedback network is formed in the operational amplifier path establishment procedure, there may be an oscillation in the feedback network, and the oscillation leads to sudden and sharp POP noise. Therefore, to further eliminate the POP noise generated due to the oscillation in the operational amplifier path establishment procedure, a compensation circuit may be further added in this application to avoid the POP noise caused by an oscillation signal in the feedback network. Specifically, a loop compensation circuit (compensation module) may be disposed in the foregoing audio processing circuit, and the loop compensation circuit may be further configured to maintain a gain stability of the closed-loop system. The loop compensation circuit is configured to suppress, using the voltage output to the output node in an operational amplifier path in which the secondary operational amplifier is located, an oscillation signal in a closed loop through a sink current circulation during low-to-high gradual changing of an output voltage, where the output voltage is a voltage used to drive the output node in the operational amplifier path in which the secondary operational amplifier is located, that is, an output voltage in the entire second operational amplifier circuit. After the oscillation signal is suppressed using a loop compensation circuit, not only the POP noise generated by the oscillation signal is suppressed, but also the gain stability of the closed-loop system can be maintained in the operational amplifier path establishment procedure.

Optionally, in some embodiments of the present disclosure, a secondary operational amplifier and a variable-resistor circuit may be limited to be configured only at a non-ideal device that is sensitive to POP noise. If an offset voltage of a main operational amplifier in the second operational amplifier circuit is higher than a preset threshold, a secondary operational amplifier and a variable-resistor circuit may be configured for the main operational amplifier whose offset voltage is higher than the preset threshold. In the audio processing circuit, there are still many operational amplifier circuits similar to the main operational amplifier in the second operational amplifier circuit. In design of a POP noise suppression circuit, a secondary operational amplifier and a variable-resistor circuit may be configured for all or some of these non-ideal devices. This is not limited in this application.

Figure 6:
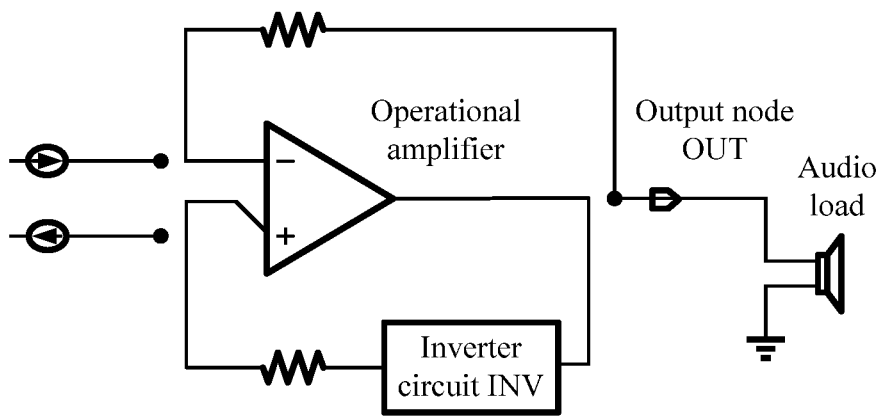
FIG. 6 is another schematic structural diagram of an audio processing circuit according to an embodiment of the present disclosure.

Optionally, in some embodiments of the present disclosure, in an audio circuit structure shown in FIG. 6, when the entire operational amplifier circuit is a current-type digital-analog converter circuit (DAC) input structure, to eliminate POP noise generated by the audio circuit in the operational amplifier path establishment procedure, the secondary operational amplifier, the variable-resistor circuit, and the like described in this application may be added correspondingly with reference to any of the embodiments in FIG. 2 to FIG. 5 and FIG. 7 to FIG. 11. In the operational amplifier path establishment procedure, only an inverter circuit (INV) needs to be turned on first, then a main operational amplifier is turned on using a POP noise suppression process in any of FIG. 2 to FIG. 5 and FIG. 7 to FIG. 11, and finally an OUT node in FIG. 6 is driven. Details are not described herein. In the current-mode DAC, a current switch pair may be controlled using input data, to direct a current to an output end or a complementary output end.

Optionally, in some embodiments of the present disclosure, POP noise is also generated in a power-down process of the audio processing circuit, and a POP noise suppression process may still be completed through coordination of the first operational amplifier circuit, the main operational amplifier, the secondary operational amplifier, and the variable-resistor circuit in the foregoing embodiments. The entire POP suppression process is reverse to the POP suppression process in the operational amplifier path establishment procedure. For example, an output resistance of the variable resistor is controlled to change gradually from low to high such that a voltage at the output node changes gradually from low to high or changes gradually from high to low. For a specific analysis process, refer to any embodiment of this application. Details are not described herein again.

Figure 7:
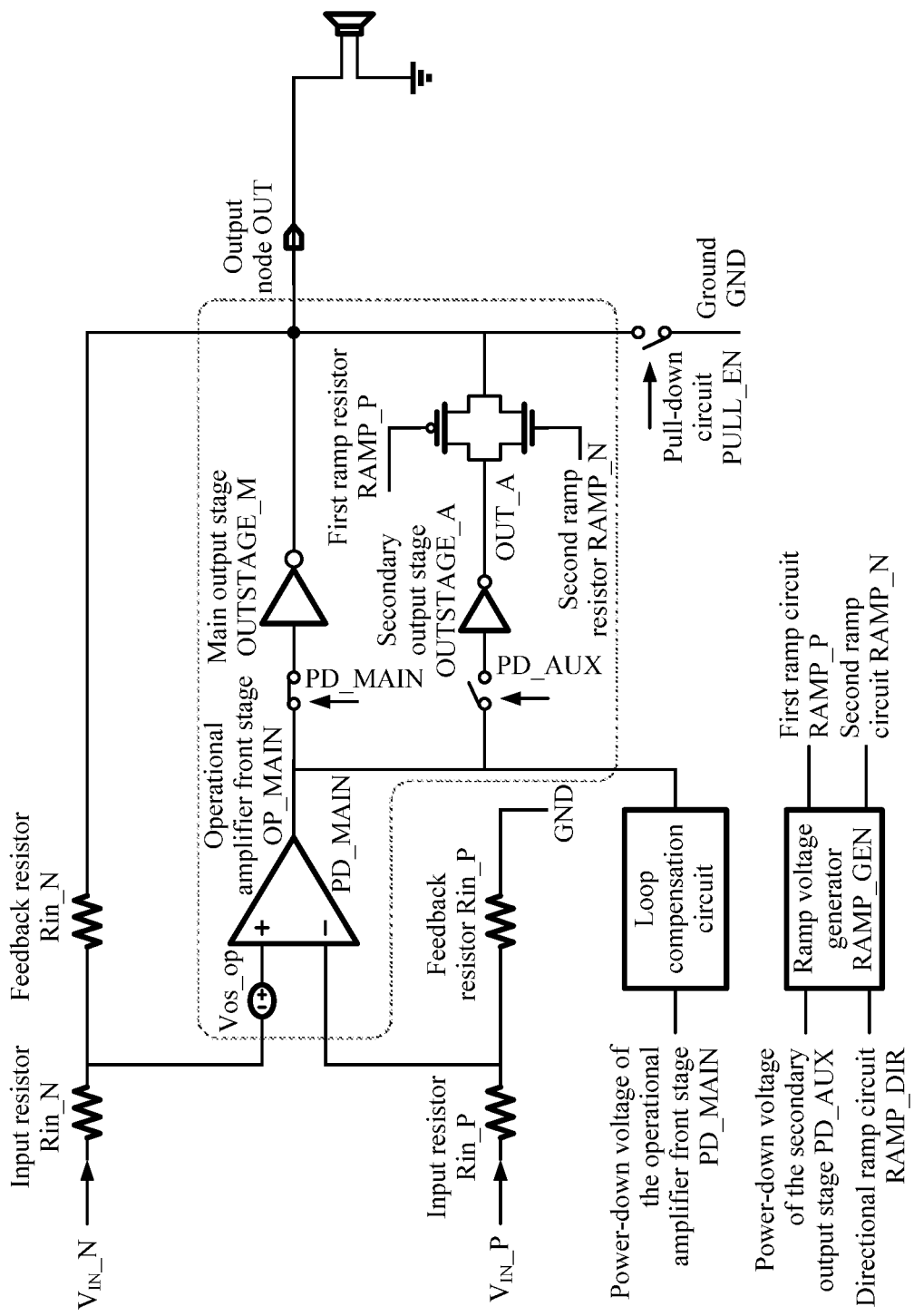
FIG. 7 is another schematic structural diagram of an audio processing circuit according to an embodiment of the present disclosure.
Figure 8:
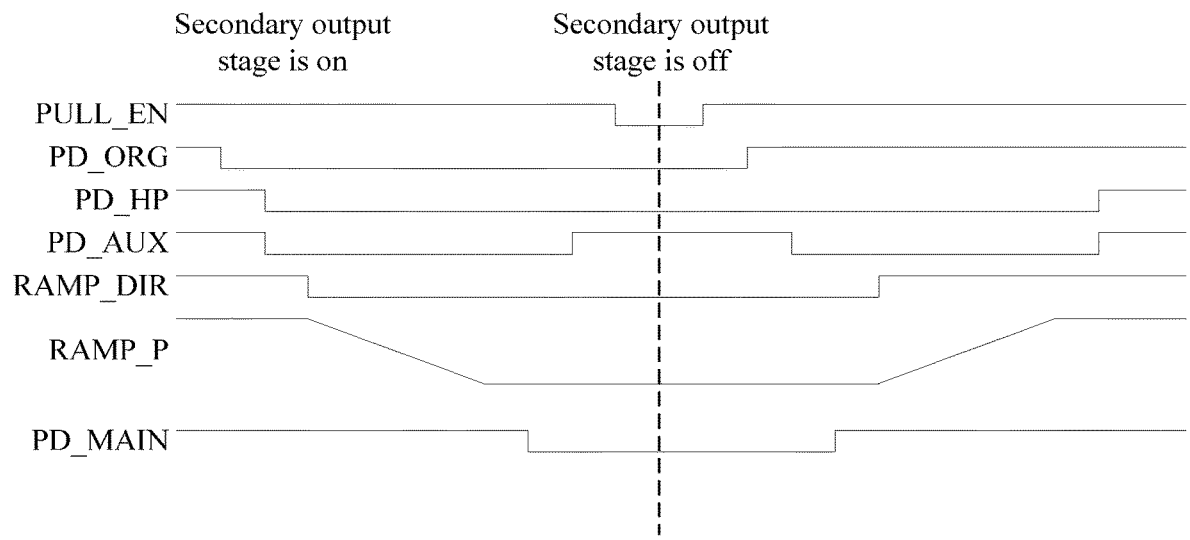
FIG. 8 is a schematic diagram of chronological change of node voltages in an audio processing circuit when an offset voltage is negative according to an embodiment of the present disclosure.
Figure 9:
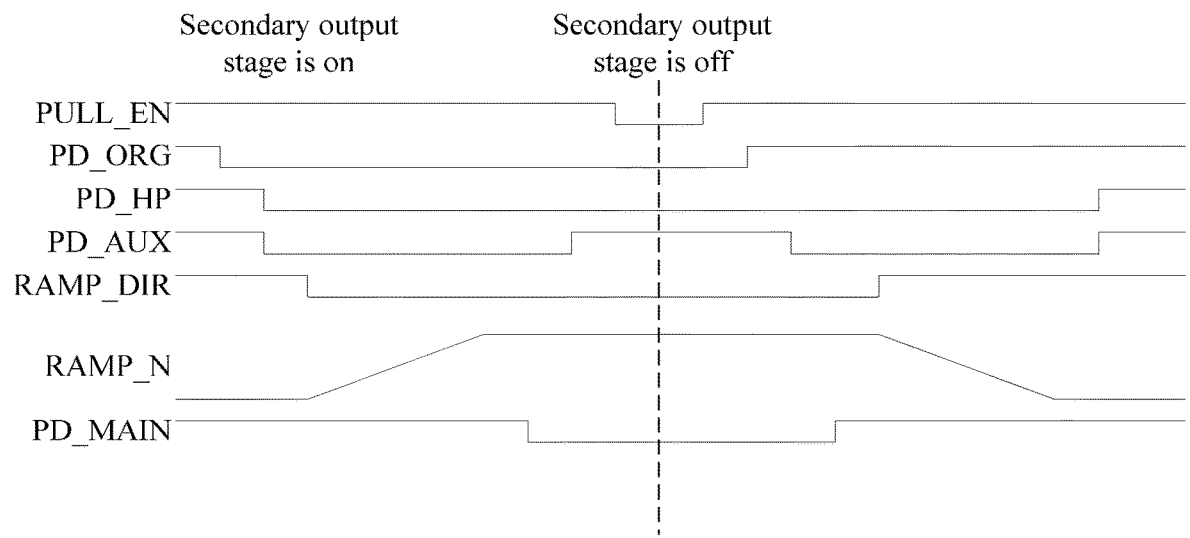
FIG. 9 is a schematic diagram of chronological change of node voltages in an audio processing circuit when an offset voltage is positive according to an embodiment of the present disclosure.
Figure 10:
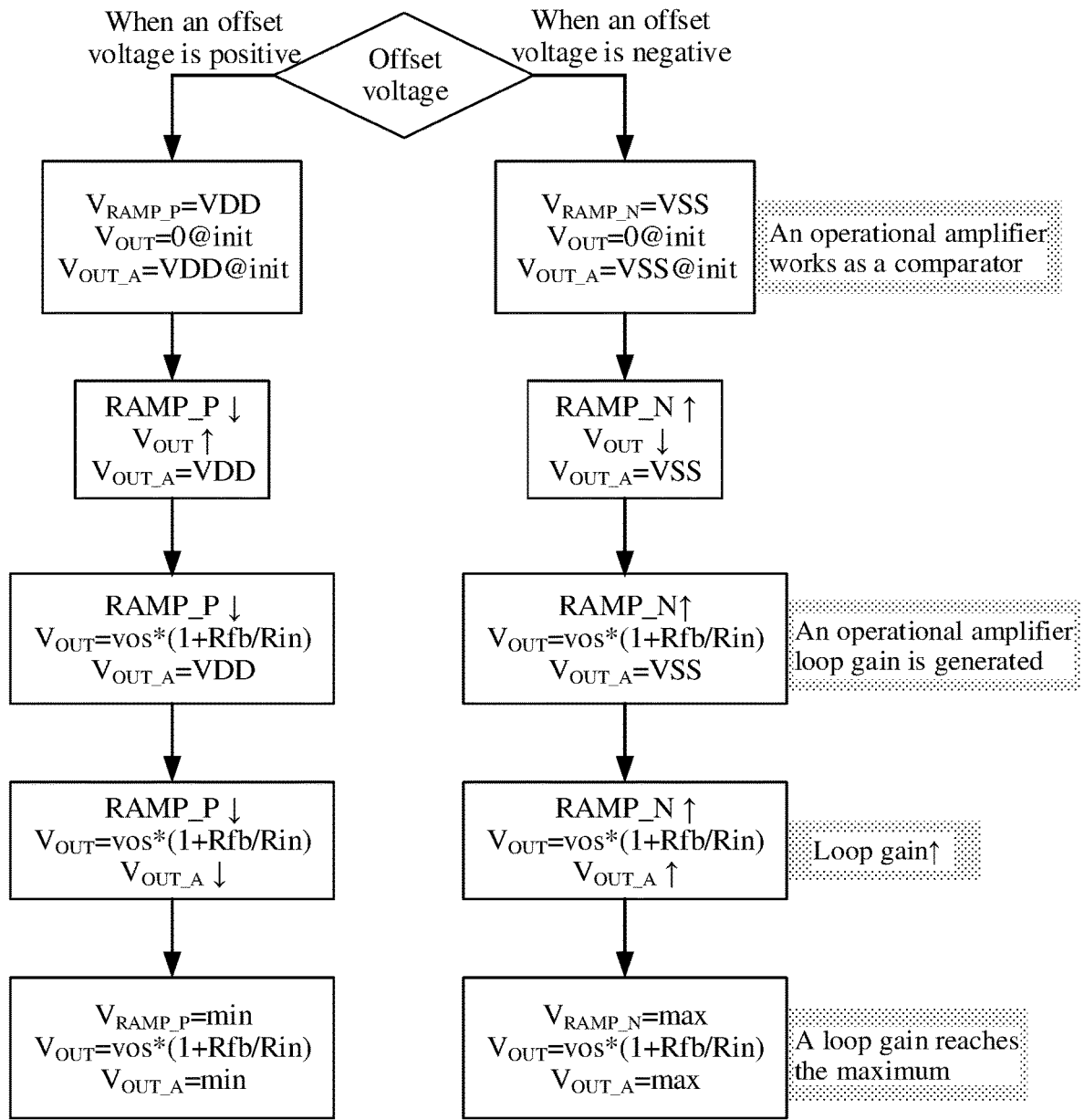
FIG. 10 is a schematic diagram of voltage changes at nodes in an audio processing circuit in which a direct current (DC) output structure is controlled by a RAMP according to an embodiment of the present disclosure.

The following uses an audio circuit structure for DC output as an example. As shown in FIG. 7, an area in the dashed line box is a cascade operational amplifier (OP) that acts as an output stage. The operational amplifier includes three parts a common operational amplifier front stage (OP_MAIN) that is controlled by a PD_HP, an operating main output stage (OUTSTAGE_M) that is controlled by a PD_MAIN, and a secondary output stage (OUTSTAGE_A) that is controlled by a PD_AUX configured to suppress POP noise in the operational amplifier path establishment procedure, and connected to the main output stage (OUTSTAGE_M) in parallel.

In FIG. 7, an OUT node is a node between the entire cascade operational amplifier and an audio load, that is, an output node that drives the audio load to operate. An audio processing circuit in FIG. 7 includes two input voltages (including a VIN_N and a VIN_P), two input resistors (including an Rin_N and an Rin_P), and two feedback resistors (including an Rfb_N and an Rfb_P). The Rin_N and the Rfb_N constitute an operational amplifier feedback network, and the Rin_P and the Rfb_P constitute an operational amplifier feedback network.

The output-stage cascade operational amplifier may further include a loop compensation circuit (compensation module) that is configured to ensure stability of the POP noise suppression process such that when a loop transfer function changes constantly, an oscillation does not cause a loop instability. The loop transfer function is a Vos transfer function about the feedback networks (including the feedback network constituted by the Rin_N and the Rfb_N, and the feedback network constituted by the Rin_P and the Rfb_P).

A ramp voltage generator (RAMP_GEN) may generate a slowly changing ramp voltage signal, to slowly establish a loop. The RAMP_GEN in this application may be an external circuit in the operational amplifier path establishment process, and is in a detachable electrical connection to the secondary output stage (OUTSTAGE_A). Alternatively, the ramp voltage generator may be a circuit module integrated in the foregoing output-stage cascade operational amplifier. This is not specifically limited in this application. The following describes the POP noise suppression process implemented based on the circuit structure shown in FIG. 7.

I. When a Vos of an operational amplifier circuit is positive, POP noise is suppressed through change of an output voltage at a ramp resistor (RAMP_P). Refer to the circuit shown in FIG. 7, a diagram of chronological change of node voltages shown in FIG. 8, and change procedures of devices shown in FIG. 10.

An operational amplifier turn-on procedure is as follows.

1. In an initial state, a pull-down circuit (PULL_EN) is made continuous, and an OUT node is pulled down to a GND by a load and a GND switch at the same time.

2. An output signal of a RAMP_GEN is configured. A RAMP signal controlling a RAMP_P level is generated by an internal time sequence circuit, for example, may be generated by a directional ramp circuit (RAMP_DIR) shown in FIG. 7. The RAMP_DIR may generate a directional ramp signal that may be used to change signal directivity.

Then, an OP_MAIN power-down voltage (PD_HP) is changed from 1 to 0 to turn on the OP_MAIN, and an OUTSTAGE_A power-down voltage (PD_AUX) is changed from 1 to 0 to turn on the OUTSTAGE_A.

Because the OP_MAIN is a non-ideal device, POP noise is generated in the OP_MAIN. The RAMP_GEN controls an output voltage of the RAMP_P to be a high level H, and a RAMP_P-controlled metal-oxide-semiconductor (MOS) transistor variable resistor is a high resistance. As a result, in this case, the operational amplifier does not drive the OUT node. It can be learned that POP noise generated in a procedure for establishing a working point by the RAMP_GEN is blocked by the RAMP_P-controlled MOS transistor variable resistor, and therefore POP noise generated by the operational amplifier front stage is not delivered to the OUT node, a voltage at the OUT node does not change abruptly, and the audio load connected to the OUT node does not generate POP noise.

In this case, because an operational amplifier feedback loop is disconnected, the entire OP may be equivalent to a comparator. Therefore, it can be learned from an offset that a voltage VOUT_A at an OUT_A node is a positive supply voltage, that is, VOUT_A=VDD.

3. The RAMP_DIR in the RAMP_GEN changes a direction, causing the RAMP_P voltage to decrease slowly. A resistance value of the RAMP-controlled variable resistor decreases slowly with the slow decrease of the RAMP_P voltage.

The VOUT_A stays as VDD at first, but in a RAMP_DIR redirecting procedure, the VOUT_A changes gradually from high to low with a voltage division relationship between the variable resistor, a PULL_EN switch, and the audio load, until VOUT_A=min. In this gradual changing procedure, a loop gain correspondingly increases slowly.

Specifically, the voltage at the OUT node VOUT=vos*(1+Rfb/Rin). Because the voltage of the RAMP_P decreases slowly, the VOUT changes slowly and gradually from the GND to a final output voltage offset. After the variable resistor decreases to be small enough, the operational amplifier loop is made continuous such that finally, a divided voltage of the audio load increases slowly, and the audio load is driven. Correspondingly, the OUT node reaches the final output voltage offset value.

Then a loop gain of the operational amplifier feedback loop increases gradually with a decrease of the variable resistor. In this procedure, a change speed of the OUT node is extremely low, and no POP noise is generated.

4. The resistance value of the variable resistor decreases gradually, an OUTSTAGE_A gain increases gradually, and finally, the OUTSTAGE_A becomes steady, the RAMP_P reaches a low level L, and the resistance value of the variable resistor in the RAMP-GEN reaches a minimum value. In this case, the loop gain reaches a maximum value, and the OUT node reaches the final output voltage offset value.

5. The OUTSTAGE_M is turned on (by changing the PD_MAIN from 1 to 0). Because the OUT node has reached the final output offset value before, turning on the OUTSTAGE_M at this moment does not cause a sudden status change of the OUT node, and does not cause generation of POP noise.

Because the OUTSTAGE_A and the OUTSTAGE_M have a common operational amplifier front stage (OP_MAIN), offsets in operational amplifier paths in which the OUTSTAGE_A and the OUTSTAGE_M are located are equal. Therefore, after the OUTSTAGE_M is turned on, making the OUTSTAGE_M path continuous does not generate new POP noise.

II. When an output voltage offset is negative, POP noise is suppressed through an output voltage change of a RAMP_N. Refer to the circuit shown in FIG. 7, a diagram of chronological change of node voltages shown in FIG. 9, and change procedures of devices shown in FIG. 10.

An operational amplifier turn-on procedure is as follows.

1. In an initial state, a PULL_EN is made continuous, and an OUT node is pulled down to a GND by a load and a GND switch at the same time.

2. An output signal of a RAMP_GEN is configured. A RAMP signal controlling a RAMP_N level is generated by an internal time sequence circuit, that is, generated by the RAMP_DIR shown in FIG. 7.

Then an OP_MAIN and an OUTSTAGE_A are turned on (by changing a PD_AUX from 1 to 0). Because the OP_MAIN is a non-ideal device, POP noise is generated in the OP_MAIN. The RAMP_GEN controls an output voltage of the RAMP_N to be a low level L, and a RAMP_N-controlled MOS transistor variable resistor is a high resistance. Therefore, POP noise generated in a procedure of establishing a working point by the RAMP_GEN is blocked by the RAMP_N-controlled MOS transistor variable resistor. As a result, POP noise generated by the operational amplifier front stage is not delivered to the OUT node, a voltage at the OUT node does not change abruptly, and the audio load connected to the OUT node does not generate POP noise.

In this case, because the operational amplifier feedback loop is disconnected, the current OP may be equivalent to a comparator. Therefore, it can be learned from an offset that a voltage VOUT_A at an OUT_A node is a negative supply voltage, that is, VOUT_A=VSS.

3. The RAMP_DIR changes a direction, causing the RAMP_N voltage to increase slowly. A resistance value of the RAMP-controlled variable resistor decreases slowly with the slow increase of the RAMP_N voltage.

The VOUT_A stays as VSS at first, but in a RAMP_DIR redirecting procedure, the VOUT_A changes gradually from low to high with a voltage division relationship between the variable resistor, a PULL_EN switch, and the audio load, until VOUT_A=max. In this gradual changing procedure, a loop gain correspondingly increases slowly.

VOUT=vos*(1+Rfb/Rin). Because the voltage of the RAMP_N increases slowly, the VOUT changes slowly and gradually from the GND to a final output voltage offset. After the variable resistor decreases to be small enough, the operational amplifier loop is made continuous such that finally, a divided voltage of the audio load increases slowly, and the audio load is driven. Correspondingly, the OUT node reaches the final output voltage offset value.

Then a loop gain of the operational amplifier feedback loop increases gradually with a decrease of the variable resistor. In this procedure, a change speed of the OUT node is extremely low, and no POP noise is generated.

4. The resistance value of the variable resistor decreases gradually, an OUTSTAGE_A gain increases gradually, and finally, the OUTSTAGE_A becomes steady, the RAMP_N reaches a high level H, and the resistance value of the variable resistor in the RAMP-GEN reaches a minimum value. In this case, the loop gain reaches a maximum value, and the OUT node reaches the final output voltage offset value.

5. The OUTSTAGE_M is turned on (by changing the PD_MAIN from 1 to 0). Because the OUT node has reached the final output offset value before, turning on the OUTSTAGE_M at this moment does not cause a sudden status change of the OUT node, and does not cause generation of POP noise.

Likewise, because the OUTSTAGE_A and the OUTSTAGE_M have a common operational amplifier front stage (OP_MAIN), offsets in operational amplifier paths in which the OUTSTAGE_A and the OUTSTAGE_M are located are equal. Therefore, after the OUTSTAGE_M is turned on, making the OUTSTAGE_M path continuous does not generate new POP noise.

An operational amplifier turn-off process is a reverse process of the turn-on process. Details are not described herein.

Figure 11:
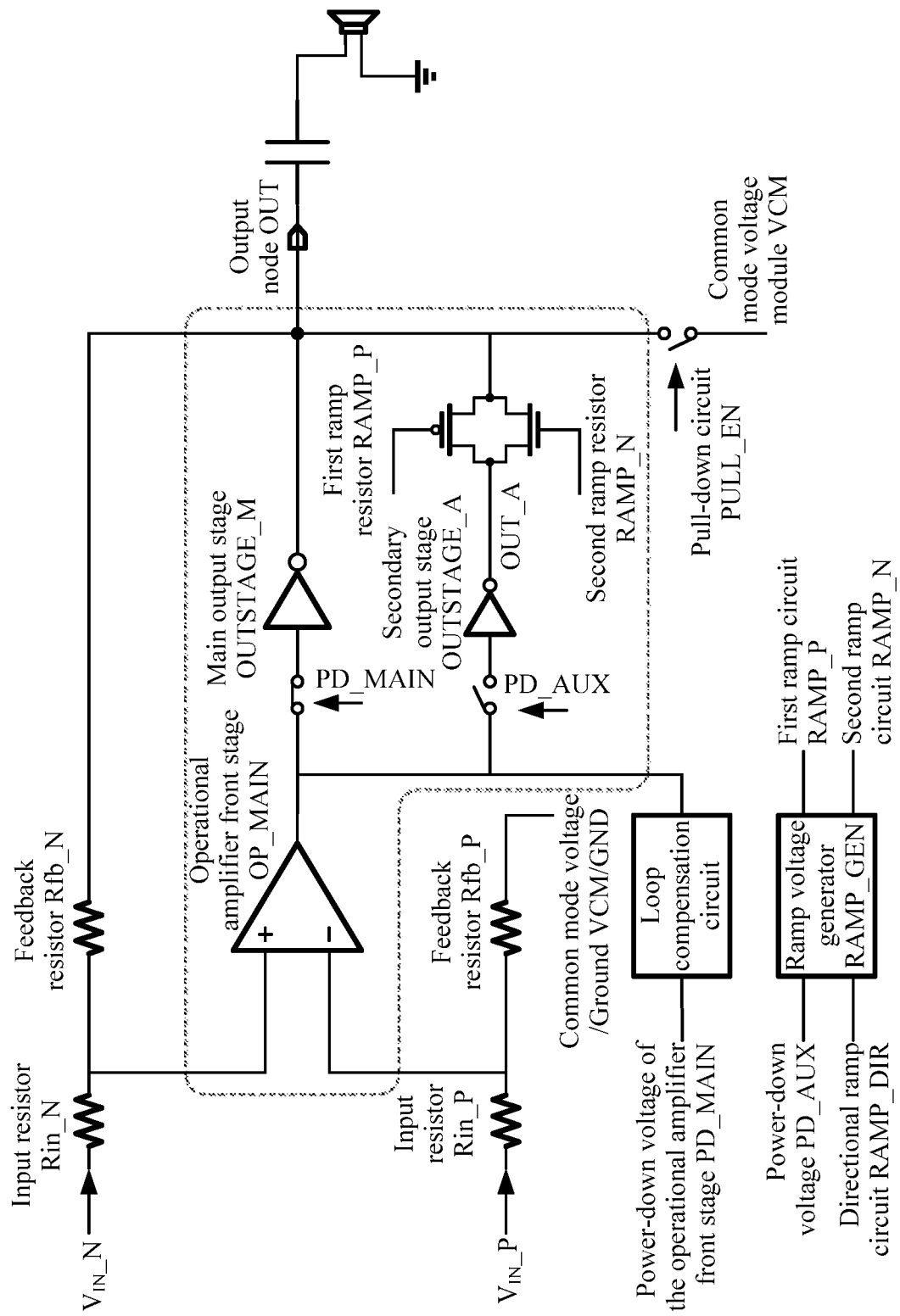
FIG. 11 is a schematic diagram of voltage changes at nodes in an audio processing circuit in which an alternating current (AC) coupling structure is controlled by a RAMP according to an embodiment of the present disclosure.

Likewise, FIG. 11 is a diagram of a POP noise suppression circuit of an audio circuit structure with AC coupling. For details about AC coupling, refer to the schematic diagram of the circuit structure shown in FIG. 11. An analysis on the POP noise suppression process in the operational amplifier path establishment procedure is not described herein.

Figure 12:
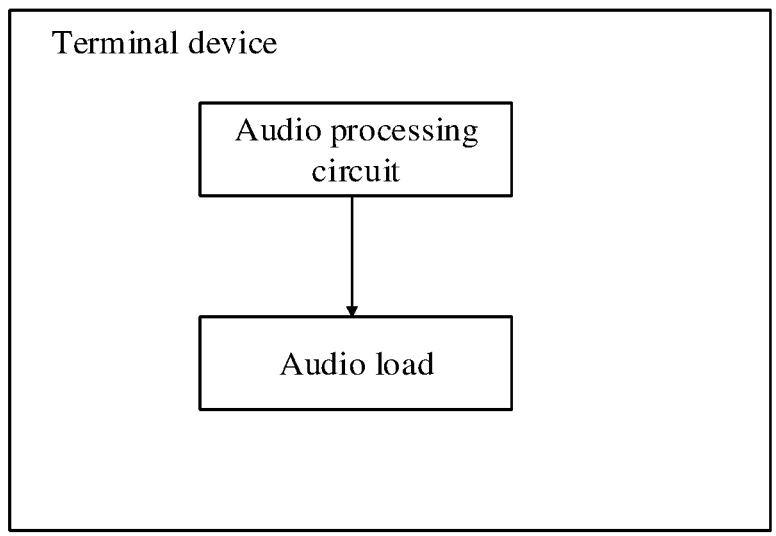
FIG. 12 is a schematic structural diagram of a terminal device according to an embodiment of the present disclosure.

Features such as the first operational amplifier circuit, the second operational amplifier circuit, the main operational amplifier, the secondary operational amplifier, the variable-resistor circuit, the ramp signal controller, the ramp signal, and the offset voltage in the embodiments corresponding to FIG. 2 to FIG. 11 are also applicable to an embodiment in this application corresponding to FIG. 12. Similar details are not described herein.

This application further provides a terminal device. The terminal device may include an audio load and the audio processing circuit according to the embodiments corresponding to FIG. 2 to FIG. 11. The audio processing circuit provides a driving voltage for the audio load. For a specific structure, refer to FIG. 12.

In the foregoing embodiments, the description of each embodiment has respective focuses. For a part that is not described in detail in an embodiment, refer to related descriptions in other embodiments.

It may be clearly understood by a person skilled in the art that, for the purpose of convenient and brief description, for a detailed working process of the foregoing system, apparatus, and circuit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the circuit division is merely logical function division and may be other division in an embodiment. For example, a plurality of circuits or components may be combined or integrated into another system, or some features may be ignored or not performed. In addition, the displayed or discussed mutual couplings or direct couplings or communication connections may be implemented through some interfaces. The indirect couplings or communication connections between the apparatuses or circuits may be implemented in electronic, mechanical, or other forms.

The circuits described as separate parts may or may not be physically separate, and parts displayed as circuits may or may not be physical circuits, may be located in one position, or may be distributed on a plurality of network circuits. Some or all of the circuits may be selected based on actual requirements to achieve the objectives of the solutions of the embodiments.

In addition, functional circuits in the embodiments of this application may be integrated into one processing circuit, or each of the circuits may exist alone physically, or two or more circuits are integrated into one circuit. The foregoing integrated circuit may be implemented in a form of hardware, or may be implemented in a form of a software functional circuit. When the integrated circuit is implemented in the form of a software functional circuit and sold or used as an independent product, the integrated circuit may be stored in a computer-readable storage medium.

All or some of the foregoing embodiments may be implemented by software, hardware, firmware, or any combination thereof. When software is used to implement the embodiments, the embodiments may be implemented completely or partially in a form of a computer program product.

The computer program product includes one or more computer instructions. When the computer program instructions are loaded and executed on the computer, the procedure or functions according to the embodiments of the present disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid-state disk (SSD)), or the like.

The technical solutions provided in this application are described in detail above. The principle and implementation of this application are described herein through specific examples. The description about the embodiments is merely provided to help understand the method and core ideas of this application. In addition, persons of ordinary skill in the art can make variations and modifications to this application in terms of the specific implementations and application scopes according to the ideas of this application. Therefore, the content of specification shall not be construed as a limit to this application.

What is claimed is:
1. An audio processing circuit, comprising:
an output node;
a cascade operational amplifier (op-amp) circuit coupled to the output node and configured to:
amplify an input voltage to obtain an amplified voltage; and
output the amplified voltage to the output node, wherein the cascade op-amp circuit comprises:
a first op-amp circuit;
a second op-amp circuit comprising a main op-amp and a secondary op-amp that are connected in parallel, wherein the first op-amp circuit is a front-stage op-amp of the second op-amp circuit, configured to:
control a voltage gain of the secondary op-amp to change gradually from low to high such that a first voltage at the output node gradually changes from low to high as an output resistance of the second op-amp circuit changes gradually after the secondary op-amp is turned on; and turn on the main op-amp after the voltage gain of the secondary op-amp reaches a preset gain; and
a loop compensation circuit configured to suppress an oscillation signal in a closed loop through a sink current circulation; and
a pull-down circuit coupled to the output node and comprising:
a first end coupled to the output node; and
a second end that is grounded or connected to a common mode voltage circuit,
wherein the pull-down circuit is configured to pull down the first voltage after the first op-amp circuit is turned on.

2. The audio processing circuit of claim 1, wherein the second op-amp circuit further comprises a variable-resistor circuit, wherein the audio processing circuit comprises a first series circuit comprising the secondary op-amp and the variable-resistor circuit, wherein the main op-amp is coupled to the first series circuit in parallel, wherein the secondary op-amp and the variable-resistor circuit are connected in series, and wherein the variable-resistor circuit is configured to:
control a second output resistance of the first series circuit to change gradually from high to low such that the voltage gain of the secondary op-amp changes gradually from low to high; and
control the first voltage at the output node to change gradually from low to high.

3. The audio processing circuit of claim 2, wherein the variable-resistor circuit comprises:
a variable resistor; and
a ramp signal controller coupled to the variable resistor and configured to:
control, after both the first op-amp circuit and the secondary op-amp are turned on, a resistance value of the variable resistor to change gradually from a first resistance value to a second resistance value when an offset voltage in the cascade op-amp circuit is positive such that the first voltage at the output node increases as the resistance value of the variable resistor changes gradually until the first voltage at the output node approaches a first voltage value, wherein the first resistance value is greater than the second resistance value, wherein the first voltage value is a positive polarity voltage value, and wherein resistance changing of the variable resistor characterizes the change of an output resistance of the first series circuit;
control the first voltage at the output node to approach the first voltage value such that an output voltage in the cascade op-amp circuit drives the output node; and
turn on the main op-amp after the first voltage approaches the first voltage value.

4. The audio processing circuit of claim 2, wherein the variable-resistor circuit comprises:
a variable resistor; and
a ramp signal controller coupled to the variable resistor and configured to:
control, after both the first op-amp circuit and the secondary op-amp are turned on, a resistance value of the variable resistor to change gradually from a first resistance value to a second resistance value when an offset voltage in the cascade op-amp circuit is negative such that the first voltage at the output node decreases as the resistance value of the variable resistor changes gradually until the first voltage at the output node approaches a second voltage value, wherein the first resistance value is greater than the second resistance value, wherein the second voltage value is a negative polarity voltage value, and wherein resistance changing of the variable resistor characterizes the change of an output resistance of the first series circuit;
control the first voltage at the output node to approach the second voltage value such that an output voltage in the cascade op-amp circuit drives the output node; and
turn on the main op-amp the first voltage approaches the second voltage value.

5. The audio processing circuit of claim 3, wherein the ramp signal controller is further configured to control, after both the first op-amp circuit and the secondary op-amp are turned on, the output resistance of the variable resistor to be equal to or higher than the first resistance value to cut off a path between the cascade op-amp circuit and the output node.

6. The audio processing circuit of claim 3, wherein the variable resistor comprises at least one of a first ramp resistor or a second ramp resistor, wherein an output level of the first ramp resistor is a first level, wherein an output level of the second ramp resistor is a second level, and wherein the ramp signal controller is further configured to control a gradually changing value of the first level so as to control the gradually changing resistance value of the variable resistor.

7. The audio processing circuit of claim 6, wherein the ramp signal controller is further configured to provide a first ramp signal after both the first op-amp circuit and the second op-amp circuit are turned on, and wherein the first ramp signal is configured to:
control a level value of the first level to change gradually from a first level value to a second level value in order to control a resistance value of the first ramp resistor to change gradually from high to low; and
control the first voltage at the output node to change gradually from low to high until the first voltage at the output node approaches the first voltage value, wherein the first level value is greater than the second level value.

8. The audio processing circuit of claim 7, wherein the output voltage in the cascade op-amp circuit is configured to drive the output node after the resistance value of the first ramp resistor is lower than a third resistance value, and wherein the third resistance value is greater than or equal to the second resistance value.

9. The audio processing circuit of claim 7, wherein a path between the cascade op-amp circuit and the output node is cut off in an initial state that the first ramp resistor gradually changes with change of the first ramp signal.

10. The audio processing circuit of claim 5, wherein the ramp signal controller is further configured to control, after both the first op-amp circuit and the secondary op-amp are turned on, the output resistance of the variable resistor to be equal to or higher than the first resistance value to cut off the path between the cascade op-amp circuit and the output node.

11. The audio processing circuit of claim 10, wherein the ramp signal controller is further configured to provide, after both the first op-amp circuit and the secondary op-amp are turned on, a second ramp signal to:
control a level value of a second level to change gradually from a third level value to a fourth level value in order to control a resistance value of a second ramp resistor to change gradually from high to low, wherein the third level value is lower than the fourth level value; and control the first voltage at the output node to change gradually from low to high until the first voltage at the output node approaches a second voltage value.

12. The audio processing circuit of claim 11, wherein the path between the cascade op-amp circuit and the output node is made continuous after the resistance value of the second ramp resistor is lower than a third resistance value, and wherein the third resistance value is greater than or equal to the second resistance value.

13. The audio processing circuit of claim 11, wherein the path between the cascade op-amp circuit and the output node is cut off in an initial state that the resistance value of the second ramp resistor gradually changes.

14. The audio processing circuit of claim 3, wherein the ramp signal controller further comprises:
a ramp signal control logic circuit;
at least one of a first ramp current source or a second ramp current source, wherein the first ramp current source is coupled to the second ramp current source in parallel; and
a pulse signal generation circuit coupled to the ramp signal control logic circuit in series and configured to:
generate a pulse signal from an input clock signal; and
input the pulse signal into the ramp signal control logic circuit,
wherein the ramp signal control logic circuit is configured to:
receive the pulse signal from the pulse signal generation circuit;
generate a ramp signal based on the pulse signal; and
input the ramp signal into a ramp current source, wherein the ramp signal comprises a first ramp signal or a second ramp signal, and wherein the ramp current source comprises the first ramp current source or the second ramp current source.

15. The audio processing circuit of claim 14, wherein the ramp signal controller further comprises a single-pole double-throw switch when the ramp signal controller comprises the first ramp current source and the second ramp current source, and wherein the single-pole double-throw switch is configured to connect to the first ramp current source when the ramp signal from the ramp signal control logic circuit has a property that is the same as or similar to that of the first ramp signal.

16. The audio processing circuit of claim 3, wherein the cascade op-amp circuit is a cascade op-amp, and wherein the cascade op-amp circuit comprises the second op-amp circuit comprising the secondary op-amp and the ramp signal controller.

17. The audio processing circuit of claim 3, wherein the variable resistor comprises at least one of a first ramp resistor or a second ramp resistor, wherein an output level of the first ramp resistor is a first level, wherein an output level of the second ramp resistor is a second level, and wherein the ramp signal controller is further configured to control a gradually changing value of the second level in order to control the resistance value of the variable resistor.

18. The audio processing circuit of claim 14, wherein the ramp signal controller further comprises a single-pole double-throw switch when the ramp signal controller comprises the first ramp current source and the second ramp current source, and wherein the single-pole double-throw switch is configured to connect to the second ramp current source when the ramp signal from the ramp signal control logic circuit has a property that is the same as or similar to that of the second ramp signal.

19. An audio processing circuit comprising:
an output node;
a cascade operational amplifier (op-amp) circuit coupled to the output node and configured to:
amplify an input voltage to obtain an amplified voltage; and
output the amplified voltage to the output node,
wherein the cascade op-amp circuit comprises:
a first op-amp circuit; and
a second op-amp circuit comprising a main op-amp coupled to a first series circuit in parallel, wherein the first series circuit comprises a secondary op-amp and a variable-resistor circuit connected in series, wherein the first op-amp circuit is a front-stage op-amp of the second op-amp circuit configured to:
control a voltage gain of the secondary op-amp to change gradually from low to high such that a first voltage at the output node gradually changes from low to high as an output resistance of the second op-amp circuit changes gradually after the secondary op-amp is turned on: and
turn on the main op-amp after the voltage gain of the secondary op-amp reaches a preset gain,
wherein the variable-resistor circuit is configured to:
control a second output resistance of the first series circuit to change gradually from high to low such that the voltage gain of the secondary op-amp changes gradually from low to high; and
control the first voltage at the output node to change gradually from low to high, and wherein an offset voltage of the main op-amp is greater than a preset threshold.

20. The audio processing circuit of claim 19, wherein the cascade op-amp circuit further comprises a loop compensation circuit configured to suppress an oscillation signal in a closed loop through a sink current circulation.

* * * * *